US008596759B2

(12) United States Patent
Chida et al.

(10) Patent No.: US 8,596,759 B2
(45) Date of Patent: Dec. 3, 2013

(54) LIQUID EJECTION HEAD AND METHOD OF MANUFACTURING THE SAME

(75) Inventors: Mitsuru Chida, Yokohama (JP); Satoshi Ibe, Yokohama (JP); Hiroto Komiyama, Tokyo (JP); Yoshinori Tagawa, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 171 days.

(21) Appl. No.: 13/170,695

(22) Filed: Jun. 28, 2011

(65) Prior Publication Data

US 2012/0013682 A1 Jan. 19, 2012

(30) Foreign Application Priority Data

Jul. 14, 2010 (JP) ................................ 2010-159746

(51) Int. Cl.
*B41J 2/14* (2006.01)
*H01L 41/22* (2013.01)

(52) U.S. Cl.
USPC ........................................... 347/47; 29/25.35

(58) Field of Classification Search
USPC ........................................................ 347/64
See application file for complete search history.

(56) References Cited

U.S. PATENT DOCUMENTS

| | | | | |
|---|---|---|---|---|
| 7,287,847 | B2 | 10/2007 | Fujii et al. | |
| 7,300,596 | B2 | 11/2007 | Murayama et al. | |
| 7,523,553 | B2 | 4/2009 | Ohsumi et al. | |
| 7,901,064 | B2 | 3/2011 | Urayama et al. | |
| 2007/0207414 | A1 | 9/2007 | Murayama et al. | |
| 2007/0252872 | A1 | 11/2007 | Fujii et al. | |
| 2008/0094454 | A1 | 4/2008 | Koyama et al. | |
| 2009/0065472 | A1 | 3/2009 | Asai et al. | |
| 2009/0065476 | A1 | 3/2009 | Komiyama et al. | |
| 2009/0065481 | A1 | 3/2009 | Kishimoto et al. | |
| 2009/0065482 | A1 | 3/2009 | Komiyama et al. | |
| 2009/0191487 | A1 | 7/2009 | Murayama et al. | |
| 2009/0212008 | A1 * | 8/2009 | Uyama et al. | 216/27 |
| 2009/0225136 | A1 | 9/2009 | Fujii et al. | |
| 2011/0141193 | A1 | 6/2011 | Kurosu et al. | |
| 2011/0167636 | A1 | 7/2011 | Edamatsu et al. | |

FOREIGN PATENT DOCUMENTS

| | | | |
|---|---|---|---|
| JP | 54-51837 | A | 4/1979 |
| JP | 9-011479 | A | 1/1997 |
| JP | 10-181032 | A | 7/1998 |
| JP | 2005-035281 | A | 2/2005 |
| JP | 2006-315191 | A | 11/2006 |

OTHER PUBLICATIONS

Wikipedia Article—Parylene, Paragraphs 1 and 3.*
SCS Coatings Brochure—Parylene Properties, p. 2 under Parylene C-UVF (registered trade name).*

* cited by examiner

*Primary Examiner* — Lisa M Solomon
(74) *Attorney, Agent, or Firm* — Fitzpatrick, Cella, Harper & Scinto

(57) ABSTRACT

A liquid ejection head includes a flow path forming member having an ejection orifice for ejecting liquid therefrom and a liquid flow path communicated with the ejection orifice, a silicon substrate including a supply port for supplying the liquid to the liquid flow path, and a protective film which is formed on a wall surface of the supply port and which is formed of an organic resin which is of the same material as that of a member forming the flow path forming member.

6 Claims, 6 Drawing Sheets

LIQUID EJECTION HEAD AND METHOD OF MANUFACTURING THE SAME

BACKGROUND OF THE INVENTION

1. Field of the Invention

The present invention relates to a liquid ejection head for ejecting liquid and a method of manufacturing the same.

2. Description of the Related Art

An ink jet printing method disclosed in Japanese Patent Application Laid-Open No. S54-51837 is a method in which liquid is ejected by causing thermal energy, which is the driving force for liquid droplet ejection, to act on the liquid. More specifically, in the ink jet printing method, liquid acted on by thermal energy develops air bubbles as the liquid is vaporized by being heated. By expansive force which accompanies the growth of air bubbles, a liquid droplet is ejected onto a print medium from an ejection orifice. Such liquid droplets cause predetermined image information such as characters or an image to be printed on the print medium. A print head used in this method includes, for example, the following:

(1) an ejection orifice for ejecting liquid therefrom;

(2) a liquid chamber communicated with the ejection orifice for supplying the liquid for ejecting;

(3) a heat storing layer for storing heat generated by the ejection energy generating element;

(4) an ejection energy generating element for generating thermal energy for causing a liquid droplet to be ejected from the ejection orifice; and (5) a passivation layer for protecting the ejection energy generating element against the liquid.

Further, Japanese Patent Application Laid-Open No. H09-011479 discloses a method in which an ink supply port communicated with the above-mentioned liquid chamber for supplying liquid to the liquid chamber is formed by anisotropic etching. Further, Japanese Patent Application Laid-Open No. H10-181032 discloses a method in which a sacrificial layer is used to form the ink supply port with high precision. Still further, Japanese Patent Application Laid-Open No. 2005-035281 discloses a method in which a process of forming the sacrificial layer is simplified.

In the methods in which the ink supply port is formed as described in the above-mentioned documents, crystal anisotropic etching of an Si substrate having a <100> surface orientation with an alkaline solution is used. This utilizes difference in the rate of dissolving in an alkaline solution depending on the surface orientation. More specifically, the etching progresses so as to leave a <111> surface having an extremely low rate of dissolving.

Here, the ink supply port formed by crystal anisotropic etching has a structure in which an exposed silicon surface is in direct contact with ink. In recent years, as print quality of ink jet printers is improved, materials having various concentrations and materials which are strongly alkaline of pH 7 or higher have become more frequently used. Then, ink in contact with a silicon portion may dissolve the silicon. Therefore, it is desired to protect with an ink-resistant member the ink supply port which is in direct contact with ink. For example, Japanese Patent Application Laid-Open No. 2006-315191 discloses a method in which a protective layer is formed by forming an inorganic film on the ink supply port and on a part of an ink flow path.

Study by the present inventors reveals that, in the method disclosed in the above-mentioned Japanese Patent Application Laid-Open No. 2006-315191, coverage may be insufficient, because an inorganic film is formed on the ink supply port by sputtering. Further, large-scale facilities such as film formation equipment and large-scale processes are required, and thus, the costs may increase.

SUMMARY OF THE INVENTION

It is an object of the present invention to provide a liquid ejection head which includes a protective film in a supply port such as an ink supply port, the protective film having excellent coverage and being able to be manufactured with ease.

According to the present invention, a liquid ejection head includes:

- a flow path forming member including:
  - an ejection orifice for ejecting liquid therefrom; and
  - a liquid flow path communicated with the ejection orifice;
- a silicon substrate including a supply port for supplying the liquid to the liquid flow path; and
- a protective film which is formed on a wall surface of the supply port and hick is formed of an organic resin which is the same as a material of a member forming the flow path forming member.

Further, according to the present invention, a method of manufacturing a liquid ejection head, the liquid ejection head including:

- a flow path forming member including:
  - an ejection orifice for ejecting liquid therefrom; and
  - a liquid flow path communicated with the ejection orifice; and
- a silicon substrate including an ejection energy generating element for ejecting the liquid, and a supply port for supplying the liquid to the liquid flow path,
- the flow path forming member including a covering resin layer which forms a wall surface of the liquid flow path, and an adhering resin layer provided between the silicon substrate and the covering resin layer,
- the method including:

(a) preparing a silicon substrate having the ejection energy generating element and a sacrificial layer for controlling dimensions of the supply port which are formed on a front surface thereof, and having a passivation layer which is formed on the ejection energy generating element and the sacrificial layer and which is formed on a side opposite to the silicon substrate;

(b) forming, by dry etching, grooves in the passivation layer along side surfaces of the sacrificial layer;

(c) filling the grooves with a first organic resin which is the same as one of a material of the covering resin layer and a material of the adhering resin layer;

(d) forming the adhering resin layer on the passivation layer;

(e) forming, on a surface of the silicon substrate which is opposite to a surface where the flow path forming member is provided, an etching mask layer for forming the supply port;

(f) forming, at least on the first organic resin, a flow path mold member to be a mold material of the liquid flow path;

(g) forming the covering resin layer at least on the adhering resin layer and on the flow path mold member;

(h) performing crystal anisotropic etching treatment of the silicon substrate using the etching mask layer until an etched surface reaches the sacrificial layer and the sacrificial layer is removed to form the supply port;

(i) forming, by the crystal anisotropic etching, a second organic resin which is the same as one of the material of the covering resin layer and the material of the adhering resin layer on a wall surface of the supply port which is opened to reach the passivation layer that also serves as an etching stop layer; and (j) removing a portion of the passivation layer which is exposed in the supply port.

Further features of the present invention will become apparent from the following description of exemplary embodiments with reference to the attached drawings.

DESCRIPTION OF THE EMBODIMENT

Figure 1:
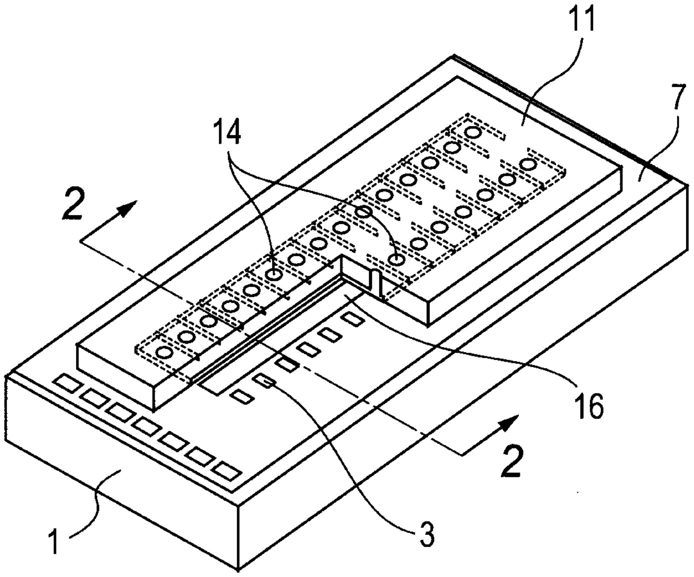
FIG. 1 is a schematic perspective view illustrating an ink jet recording head according to an embodiment of the present invention.

Preferred embodiments of the present invention will now be described in detail in accordance with the accompanying drawings.

A liquid ejection head according to the present invention includes a flow path forming member which includes an ejection orifice for ejecting liquid therefrom and a liquid flow path communicated with the ejection orifice, and a silicon substrate which includes a supply port for supplying liquid to the liquid flow path.

Further, the liquid ejection head according to the present invention includes a protective film formed on a wall surface of the supply port, the protective film being formed of an organic resin which is the same as a material of a member forming the flow path forming member.

The flow path forming member includes a covering resin layer forming a wall surface of the liquid flow path and an adhering resin layer disposed between the silicon substrate and the covering resin layer. Therefore, the protective film is formed using a material which is the same as that of the covering resin layer or that of the adhering resin layer. Note that, "the same material" as used herein refers to a material of the same kind. For example, when the covering resin layer or the adhering resin layer is formed of a polyamide resin, the protective film is also formed of a polyamide resin. It is preferred that the covering resin layer or the adhering resin layer and the protective film have similar structures and similar molecular-weight distributions.

As the covering resin layer, for example, a photosensitive epoxy resin, a photosensitive acrylic resin, or the like may be used, and it is preferred that a cationically polymerizable compound by photoreaction be used. Further, as the material of the flow path forming member, the durability and the like thereof vary greatly depending on the kind and characteristics of the liquid used, and thus, an appropriate compound may be selected depending on the liquid such as ink to be used.

As the adhering resin layer, for example, a polyamide resin may be used.

The covering resin layer which forms the wall surface of the liquid flow path is generally formed of a material which is resistant to the liquid flowing through the liquid flow path. Therefore, by forming the protective film in the supply port of a material which is the same as that of the covering resin layer forming the wall surface of the ink flow path, the wall surface of the supply port may be effectively protected. Further, the polyamide resin used as the adhering resin layer is also generally a material which is highly resistant to liquid and excellent in resistance to ink.

Further, it is preferred that the protective film be formed not only on the wall surface of the supply port but also on a bottom portion of the liquid flow path. It is preferred that the protective film provided on the bottom portion of the liquid flow path be formed of a material which is the same as that of the adhering resin layer. This is because forming the protective film provided on the bottom portion of the liquid flow path of a material which is the same as that of the adhering resin layer enables patterning and forming the protective film provided on the bottom portion of the liquid flow path simultaneously with the adhering resin layer, which is advantageous from the viewpoint of the manufacturing process steps.

Further, it is preferred that the protective film formed on the bottom portion of the liquid flow path and the adhering resin layer be uneven in shape. This is because their unevenness in shape may improve wettability with liquid such as ink, and further, may improve adherence between the silicon substrate and the covering resin layer. In particular, in this case, if the protective film and the adhering resin layer are formed of the same material, the uneven shape may be simultaneously formed by photolithography or the like.

The uneven shape may be formed by, for example, half etching the adhering resin layer. The uneven shape has a depth of, for example, 1.0 μm to 1.5 μm. The uneven shape may be in the shape of, for example, a circle or a polygon in horizontal section. The uneven shape may have a side of about 5 μm. Further, it is preferred that the uneven shape have unevenness as much as possible formed therein in order to improve the wettability and the adherence.

A liquid ejection head according to an embodiment of the present invention is described in the following. In the description below, an ink jet recording head as an exemplary application of the present invention is described, but the present invention is not limited thereto, and may also be applied to a liquid ejection head for manufacturing a biochip or for printing an electronic circuit. Exemplary liquid ejection heads include not only an ink jet recording head but also a head for manufacturing a color filter.

Figure 2:
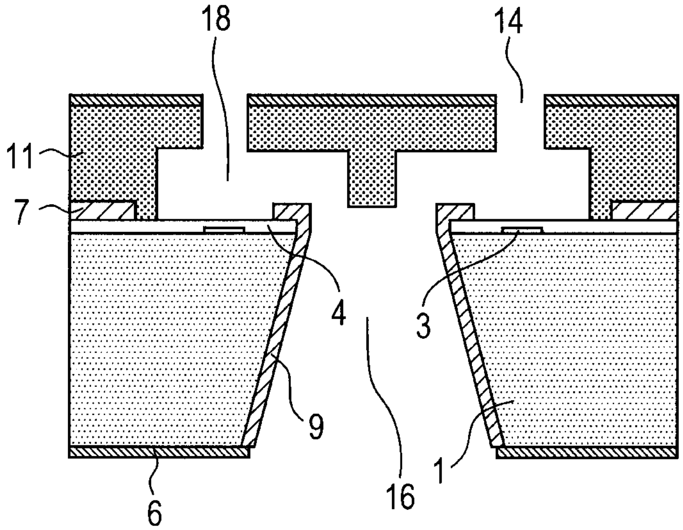
FIG. 2 is a schematic vertical sectional view illustrating the ink jet recording head according to the embodiment of the present invention.
Figure 3:
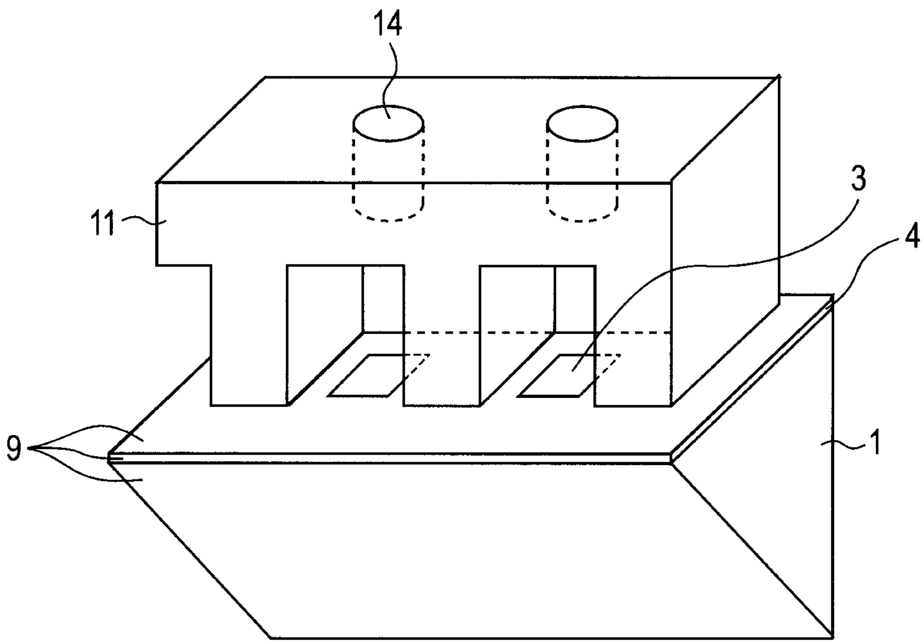
FIG. 3 is a schematic perspective view illustrating the ink jet recording head according to the embodiment of the present invention.

FIG. 1 is a schematic perspective view illustrating an ink jet recording head according to the embodiment of the present invention. FIG. 2 is a schematic sectional view taken along the line 2-2 of FIG. 1 illustrating the ink jet recording head according to the embodiment of the present invention. FIG. 3 is a schematic perspective view illustrating the ink jet recording head according to the embodiment of the present invention.

The ink jet recording head includes a silicon substrate 1 having two lines of ejection energy generating elements 3 at predetermined pitches formed therein, and a flow path forming member disposed above the silicon substrate. The flow path forming member includes therein an ink ejection orifice 14 for ejecting ink therefrom and an ink flow path 18 for supplying ink to the ink ejection orifice 14. An ink supply port 16 for supplying ink to the ink flow path 18 is provided in the silicon substrate 1.

The silicon substrate 1 has a passivation layer 4 for protecting the ejection energy generating elements 3 on a surface side on which the ejection energy generating elements 3 are formed. The flow path forming member includes at least a covering resin layer 11 which forms a wall surface of the ink flow path 18 and an adhering resin layer 7 disposed between the silicon substrate and the covering resin layer 11. Note that, the passivation layer also has a function of, when the ink supply port is formed by crystal anisotropic etching, stopping the etching and thus, the passivation layer 4 is also referred to as an etching stop layer in the following.

As the adhering resin layer 7 used for the purpose of improving adherence between the silicon substrate 1 and the covering resin layer 11, for example, a polyamide resin may be used.

The covering resin layer 11 forms the ink flow path 18 and the ink ejection orifice 14 which is open above the ejection energy generating element 3.

A silicon oxide film 6 is formed on a surface of the silicon substrate 1 which is opposite to the flow path forming member side. The ink supply port 16 may be formed by crystal anisotropic etching of Si with the silicon oxide film 6 being used as a mask.

The ink supply port 16 opens between two lines of the ejection energy generating elements 3. Further, a wall surface of the ink supply port 16 has a protective film 9 formed thereon. The protective film 9 is formed of an organic resin which is the same as a material of a member forming the flow path forming member. More specifically, the wall surface of the ink supply port 16 is covered with an organic resin which is the same as a material of the covering resin layer 11 or a material of the adhering resin layer 7. This structure may add to the ink supply port 16 resistance to ink. Further, an organic resin has excellent coverage, and thus, may effectively protect the wall surface of the ink supply port 16. Further, by using the same material, the number of the process steps may be reduced.

In the ink jet recording head, by applying to ink (liquid) which fills the ink flow path 18 via the ink supply port 16 pressure generated by the ejection energy generating element 3, ink droplets are caused to be ejected from the ink ejection orifice 14. By causing the ejected ink droplets to adhere to a recording medium, recording may be performed on the recording medium.

The ink jet recording head may be mounted on such apparatuses as a printer, a copying machine, a facsimile having a communication system, and a word processor having a printer portion, and further, on a recording apparatus for industrial use which is combined with various kinds of processing apparatuses. By using the ink jet recording head, recording may be performed on various kinds of recording media such as paper, thread, fabric, leather, metal, plastic, glass, lumber, and ceramic. Note that, "recording" as used herein means not only providing an image having meaning such as text or graphics to a recording medium but also providing an image having no meaning such as a pattern.

A method of manufacturing an ink jet recording head according to the embodiment of the present invention is described in the following with reference to FIGS. 4A to 4F and 5A to 5E. Note that, the present invention is not limited to the embodiment described below, and may be applied to technologies which should fall within the scope of the present invention claimed.

Figure 4A:
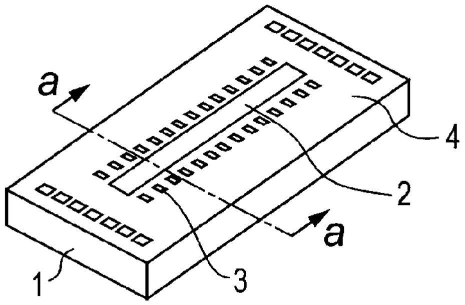
FIG. 4A is a perspective view illustrating a manufacturing method of this embodiment.
Figure 4D:
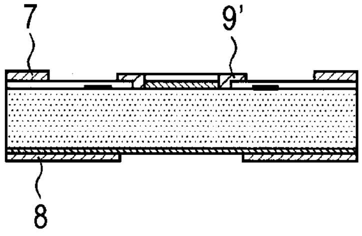
FIGS. 4B, 4C, 4D, 4E and 4F are sectional views illustrating manufacturing process steps of this embodiment.
Figure 4B:
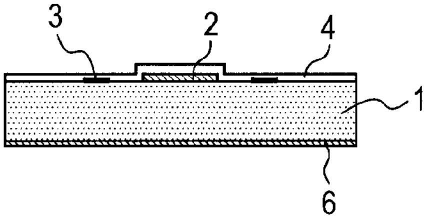
Figure 4E:
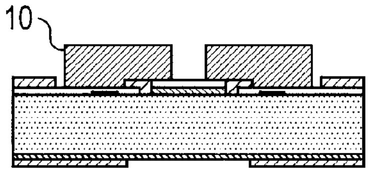
Figure 4C:
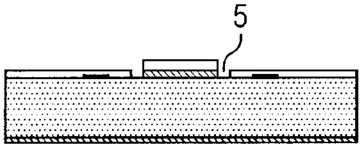
Figure 4F:
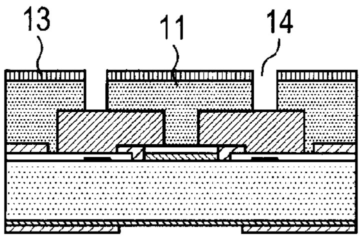
Figure 5A:
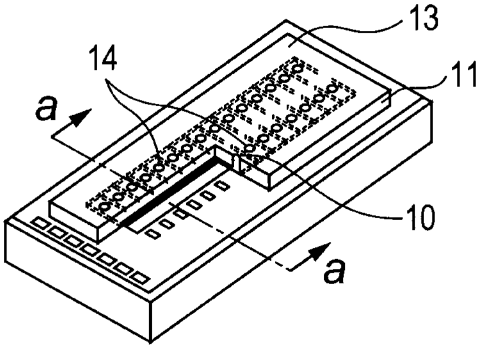
FIG. 5A is a perspective view illustrating the manufacturing method of this embodiment.

FIGS. 4A and 5A are schematic perspective views for illustrating manufacturing process steps of the ink jet recording head according to this embodiment, and FIGS. 4B to 4F and 5B to 5E are schematic sectional views for illustrating the manufacturing process steps of the ink jet recording head according to this embodiment.

FIG. 4A is a schematic perspective view of the silicon substrate 1 to be used. FIGS. 4B to 4F are vertical sectional views, explaining based on cross section taken along the line a-a of FIG. 4A. A plurality of ejection energy generating elements 3 such as heat-generating resistors is provided on the silicon substrate 1. Further, the rear surface of the silicon substrate 1 is covered with the silicon oxide film 6. A sacrificial layer 2 which is required when the ink supply port 16 is formed with an alkaline solution is provided on the silicon substrate 1. Further, the etching stop layer (passivation layer) 4 is provided on the silicon substrate 1, the ejection energy generating elements 3, and the sacrificial layer 2. Note that, wiring for heaters which form the ejection energy generating elements 3, a circuit for driving the heaters, a heat storing layer, and the like are not illustrated in the drawings. The passivation layer 4 is formed on the ejection energy generating elements 3 and the sacrificial layer 2 on a side opposite to the silicon substrate 1 side.

The sacrificial layer 2 is formed of a material which may be etched with an alkaline solution, for example, polysilicon, aluminum having a high etching rate, aluminum silicon, aluminum copper, or aluminum silicon copper. By providing the sacrificial layer 2, the supply port 16 may be formed with the dimensions of the supply port being controlled.

The etching stop layer 4 is formed of a material which is, after the sacrificial layer 2 is exposed by anisotropic etching, not etched or less liable to be etched with an alkaline solution. For example, silicon oxide which is located on a rear surface side of the heaters and which may also be used as a heat storing layer, or silicon nitride which is located above the heaters and which may also be used as a protective film may be used.

Next, as illustrated in FIG. 4C, grooves 5 are formed in the etching stop layer 4 along side surfaces of the sacrificial layer 2 on the silicon substrate 1.

The grooves 5 may be formed by, for example, applying a positive resist by spin coating, exposing and developing the positive resist, and patterning the etching stop layer 4 by dry etching or the like. The positive resist used as a mask is removed. The grooves 5 are formed so as to expose the silicon substrate 1.

Then, as illustrated in FIG. 4D, an organic resin which is the same as the material of the covering resin layer 11 is applied on the silicon substrate 1 by spin coating or the like to fill a first organic resin in the grooves 5 formed in the etching stop layer 4. Then, exposure with ultraviolet radiation, deep UV light, or the like and development are carried out to pattern the first organic resin so as to be provided around a border between the ink supply port 16 and the ink flow path 18 which are to be formed, and an upper protective film 9' which is to form an upper portion of the protective film 9 is formed.

Further, the adhering resin layer 7 and an etching mask layer 8 are formed on a front surface (an upper surface in FIG. 4D) and the rear surface (a lower surface in the FIG. 4D), respectively, of the silicon substrate 1.

The adhering resin layer 7 may be formed by, for example, applying a resin material such as a polyamide resin and curing the resin material by baking. The adhering resin layer 7 may also be formed by, after a positive resist is applied by spin coating and the positive resist is exposed and developed to form a mask, performing patterning by dry etching or the like. The etching mask layer 8 may be formed similarly. The etching mask layer 8 is formed on the surface of the silicon substrate 1 which is opposite to the flow path forming member side.

Next, as illustrated in FIG. 4E, a flow path mold member 10 to be a mold of the ink flow path 18 is formed on the front surface side of the silicon substrate 1. The flow path mold member 10 may be formed by, for example, patterning a positive resist.

Then, as illustrated in FIG. 4F, the covering resin layer 11 and a liquid-repellent layer 13 are formed on the flow path mold member 10 and the adhering resin layer 7. Note that, FIG. 5A is a schematic perspective view illustrating the same state as that illustrated in FIG. 4F. Further, FIGS. 5B to 5E are explanatory diagrams based on a section taken along the line a-a of FIG. 5A.

The covering resin layer 11 and the liquid-repellent layer 13 may be formed in, for example, the following way. First, a covering resin material is provided on the front surface side of the silicon substrate by spin coating or the like, and further, a liquid-repellent material is formed thereon by laminating a dry film or the like. Then, exposure with ultraviolet radiation, deep UV light, or the like and development are carried out to pattern the covering resin layer 11 and the liquid-repellent layer 13, and the ink ejection orifice 14 is formed. As the liquid-repellent material, for example, a water-repellent material may be used.

Figure 5D:
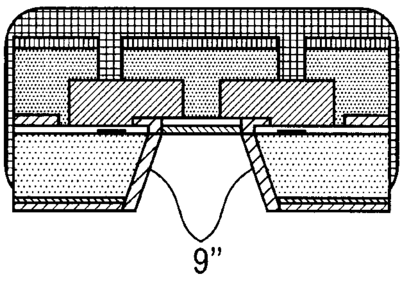
FIGS. 5B, 5C, 5D and 5E are sectional views illustrating manufacturing process steps of this embodiment.
Figure 5B:
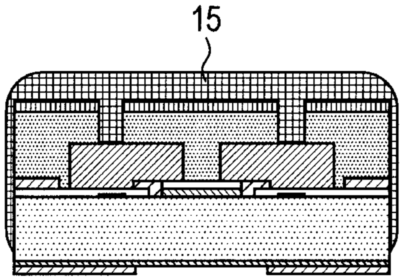

Next, as illustrated in FIG. 5B, a protective material 15 for protecting side surfaces of the silicon substrate 1, the covering resin layer 11, the flow path mold member 10, and the like is formed by spin coating.

Figure 5E:
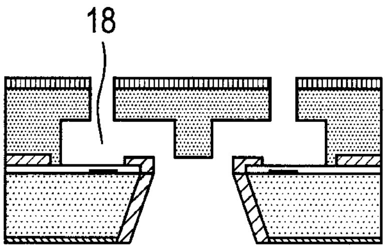
Figure 5C:
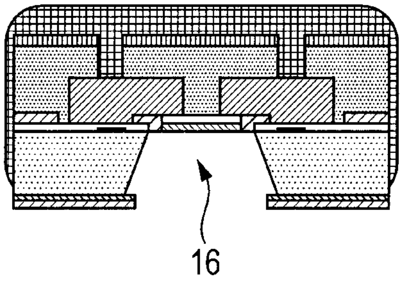

Then, as illustrated in FIG. 5C, after the silicon oxide film 6 is etched to expose an Si surface to be an etching start surface, crystal anisotropic etching treatment is performed to form the ink supply port 16. By the crystal anisotropic etching treatment, an etched surface reaches the sacrificial layer 2 and the sacrificial layer 2 is removed.

More specifically, first, the silicon oxide film 6 on the rear surface of the silicon substrate 1 in a port in the etching mask layer 8 is removed with the etching mask layer 8 being used as a mask. After that, etching is performed from the rear surface of the silicon substrate 1 with TMAH being used as an anisotropic etchant to form the ink supply port 16.

Here, the silicon is caused to recede until, after the etching from the rear surface passes through the silicon substrate 1 and removes the sacrificial layer 2, the upper protective film 9' formed of the organic resin which fills the grooves 5 formed in the etching stop layer 4 is exposed.

Then, as illustrated in FIG. 5D, an organic resin as a second organic resin which is the same as the covering resin material is applied from the rear surface by spin coating or the like to a region including the wall surface of the ink supply port 16. Then, exposure with ultraviolet radiation, deep UV light, or the like and development are carried out to perform patterning so that the second organic resin remains on the wall surface of the ink supply port 16 to form a side surface protective film 9" for protecting side surfaces of the ink supply port 16. More specifically, the organic resin on a portion which had the sacrificial layer 2 and on the etching mask layer 8 is removed and a film for protecting silicon which is exposed on the side surfaces of the ink supply port 16 is formed. Note that, in this embodiment, a protective film having the upper protective film 9' and the side surface protective film 9" is formed.

Then, as illustrated in FIG. 5E, the etching mask layer 8 and a portion of the etching stop layer 4 existing in the ink supply port 16 on the ink flow path 18 side are removed by dry etching.

Further, the protective material 15 is removed. Further, the flow path mold member 10 is caused to be eluted from the ink supply port 16, thereby forming the ink flow path 18.

After that, the substrate having the ink flow path 18 and the like formed therein is cut and separated with a dicing saw or the like to form chips. Further, after making electrical connection for driving the ejection energy generating elements 3, a chip tank member for supplying ink is connected, to thereby complete the ink jet recording head.

In the above description of the manufacturing method, the organic resin which is the same as the covering resin material is applied on the wall surface of the ink supply port 16 to protect the wall surface, but an organic resin which is the same as an adhering resin material may also be used to protect the wall surface of the ink supply port 16.

Further, the manufacturing method which is described by way of example in this embodiment may be preferably adopted as a method of forming a protective film at a corner portion which is a junction between an ink flow path and an ink supply port.

EXAMPLE 1

Examples of the present invention are described in the following, but the present invention is not limited thereto.

First, as illustrated in FIGS. 4A and 4B, the silicon substrate 1 having the plurality of ejection energy generating elements 3, the sacrificial layer 2, and the etching stop layer 4 formed on an upper side thereof was prepared. More specifically, the silicon substrate 1 having the plurality of ejection energy generating elements (material: TaSiN) and a plurality of drivers and logic circuits (not shown) formed thereon and having a heat storing layer (not shown) and the etching stop layer (SiN) 4 at a portion at which the flow path 18 was to be formed was prepared. Further, the sacrificial layer 2 for precisely forming an upper portion of the ink supply port 16 was provided on the silicon substrate 1 (FIGS. 4A and 4B).

Then, IP5700 (trade name) manufactured by TOKYO OHKA KOGYO CO., LTD. which was a positive resist was applied on the silicon substrate 1 at a thickness of 5 μm by spin coating. Then, a photomask was used to carry out collective exposure at a width of 5 μm on the substrate 1 along the side surfaces of the sacrificial layer 2 with projection exposure equipment using i, h, and g lines. Then, development was performed with NMD-3 (trade name) manufactured by TOKYO OHKA KOGYO CO., LTD., and the exposed portion of the etching stop layer 4 on the silicon substrate 1 was removed by chemical dry etching. Then, the resist was removed by a remover 1112A (trade name) manufactured by ROHM Co., Ltd. (FIG. 4C).

Next, a negative photosensitive resin which was the material of the covering resin layer 11 forming the flow path forming member was applied on the silicon substrate 1 at a thickness of 2 μm by spin coating to fill the grooves 5 formed along the side surfaces of the sacrificial layer 2.

Then, a photomask was used to carry out exposure with projection exposure equipment using i, h, and g lines, development was carried out with a liquid mixture containing 60% of xylene and 40% of MIBK, and patterning was performed so that the photosensitive resin filling the grooves 5 remained to form the upper protective film 9'.

Next, the adhering resin layer 7 and the etching mask layer 8 were formed on the front surface side (upper side) and the rear surface side (lower side), respectively, of the silicon substrate 1. More specifically, first, a polyamide resin which was the material of the adhering resin layer 7 and the etching mask layer 8 was applied at a thickness of 2 μm by spin coating and was baked in an oven furnace at 100° C. for 30 minutes plus at 250° C. for 60 minutes to be cured. Then, the above-mentioned IP5700 (trade name) manufactured by TOKYO OHKA KOGYO CO., LTD. was applied on the front surface side and the rear surface side of the silicon substrate 1 at a thickness of 5 μm by spin coating, and a photomask was used to carry out collective exposure on the rear surface with projection exposure equipment using i, h, and g lines. Next, development was performed with NMD-3 (trade name) manufactured by TOKYO OHKA KOGYO CO., LTD., the exposed polyamide resin was removed by chemical dry etching, and the resist was removed by the remover 1112A (trade name) manufactured by ROHM Co., Ltd. Further, the above-mentioned IP5700 (trade name) manufactured by TOKYO OHKA KOGYO CO., LTD. was applied on the front surface side and the rear surface side of the silicon substrate 1 at a thickness of 5 μm by spin coating, and a photomask was used to carry out exposure with a stepper using i line. Development was performed with NMD-3 manufactured by TOKYO OHKA KOGYO CO., LTD., the exposed polyamide resin was dry etched by RIE, and the resist was removed by the remover 1112A (trade name) manufactured by ROHM Co., Ltd. (FIG. 4D).

Then, the flow path mold member 10 was formed on the front surface side of the silicon substrate 1. More specifically, positive ODUR (trade name) manufactured by TOKYO OHKA KOGYO CO., LTD. which was the material of the flow path mold member 10 was applied at a thickness of 14 μm by spin coating. Next, a photomask was used to carry out exposure with projection exposure equipment using i, h, and g lines. Development was performed with MP-5050 (trade name) manufactured by HAYASHI PURE CHEMICAL IND., LTD. to form a mold material pattern (FIG. 4E).

Next, the negative photosensitive resin which was the material of the covering resin layer 11 was applied on the front surface side of the silicon substrate 1 having the flow path mold member 10 formed thereon at a thickness of 25 μm by spin coating, and further, the water-repellent material 13 was applied thereon at a thickness of 0.5 μm by spin coating. Then, a photomask was used to carry out exposure with a stepper using i line, development was performed with a liquid mixture containing 60% of xylene and 40% of MIBK, and cure was performed in an oven furnace at 140° C. for 60 minutes to form the ejection orifice 14 (FIG. 4F).

Next, OBC (trade name) manufactured by TOKYO OHKA KOGYO CO., LTD. was applied on the front surface side and the side surfaces side of the silicon substrate 1 at a thickness of 40 μm by spin coating as the protective material 15 (FIG. 5B).

Then, the silicon oxide film 6 to be the etching start surface for forming the ink supply port 16 was etched with BHF-U (trade name) manufactured by DAIKIN INDUSTRIES, LTD. for 15 minutes on the rear surface side of the silicon substrate 1 with the etching mask layer 8 being used as a mask.

Then, anisotropic etching was performed with TMAH-22 (tetramethylammonium hydroxide) manufactured by KANTO CHEMICAL CO., INC. and heated so that the temperature thereof was regulated to be 83° C. being used as an anisotropic etchant from the rear surface of the silicon substrate 1. The etching was performed until, after the sacrificial layer 2 was removed, the upper protective film 9' was exposed. The etching time period was calculated by: thickness of the silicon substrate 1 (μm)÷etching rate (min/μm)+overetching for 60 minutes (FIG. 5C).

Next, the side surface protective film 9" was formed on the wall surface of the ink supply port 16. More specifically, first, the negative photosensitive resin which was the same as the material of the covering resin layer 11 was applied from the rear surface side of the silicon substrate 1 at a thickness of 2 μm by spin coating. Then, a photomask was used to carry out collective exposure with projection exposure equipment using i, h, and g lines. By performing development with the liquid mixture containing 60% of xylene and 40% of MIBK, the negative photosensitive resin on the portion which had the sacrificial layer 2 and on the etching mask layer 8 was removed (FIG. 5D).

Next, the etching mask layer 8 and the etching stop layer 4 exposed in the upper portion of the ink supply port 16 were removed from the rear surface by chemical dry etching. Further, OBC as the protective material 15 was removed with 100% xylene. Still further, by soaking in methyl lactate which was heated so that the temperature thereof was regulated to be 40° C. and applying ultrasonic waves of 200 kHz/200 W, the flow path mold member 10 was caused to be eluted from the ink supply port 16, thereby forming the ink flow path 18. Further, treatment at 200° C. for 60 minutes was performed in an oven furnace to cure the covering resin layer 11 (FIG. 5E).

EXAMPLE 2

In this example, the resin which filled the grooves 5 formed along the side surfaces of the sacrificial layer 2 in FIG. 4C referred to in describing Example 1 was the same as the material of the adhering resin layer 7. More specifically, in this example, the upper protective film 9' was formed using a polyamide resin which was the same as the material of the adhering resin layer 7.

First, the polyamide resin as the adhering resin layer 7 and the etching mask layer 8 was applied at a thickness of 2 μm by spin coating on the front surface side and the rear surface side, respectively, of the silicon substrate 1 which was formed similarly to that in the case of Example 1 up to the manufacturing process step illustrated in FIG. 4C. Then, the polyamide resin was baked in the oven furnace at 100° C. for 30 minutes plus at 250° C. for 60 minutes to be cured. Then, the above-mentioned IP5700 (trade name) manufactured by TOKYO OHKA KOGYO CO., LTD. was applied on the rear surface side of the silicon substrate 1 at a thickness of 5 μm by spin coating. Next, a photomask was used to carry out collective exposure with projection exposure equipment using i, h, and g lines, and development was performed with NMD-3 (trade name) manufactured by TOKYO OHKA KOGYO CO., LTD. Then, the exposed polyamide resin was removed by chemical dry etching, and the resist was removed by the remover 1112A (trade name) manufactured by ROHM Co., Ltd., thereby forming the etching mask layer 8. Further, the above-mentioned IP5700 (trade name) manufactured by TOKYO OHKA KOGYO CO., LTD. was applied on the front surface side of the silicon substrate 1 at a thickness of 5 μm by spin coating, and a photomask was used to carry out exposure with a stepper using i line. Then, development was performed with NMD-3 manufactured by TOKYO OHKA KOGYO CO., LTD., the exposed polyamide resin was dry etched by RIE, and the resist was removed by the remover 1112A (trade name) manufactured by ROHM Co., Ltd. (FIG. 6A), thereby forming the upper protective film 9' and the adhering resin layer 7.

Figure 6A:
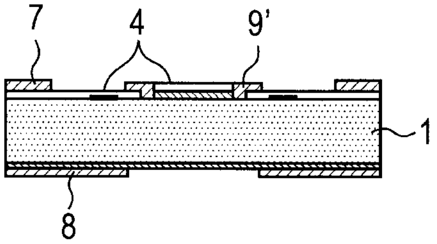
FIGS. 6A, 6B and 6C are sectional views illustrating a manufacturing method of the embodiment according to the present invention.
Figure 6B:
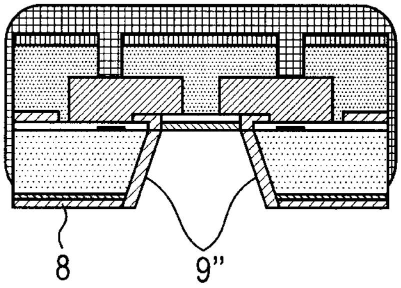
Figure 6C:
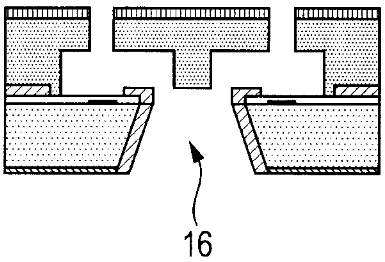

The rest of the manufacturing process steps were similar to those in the case of Example 1 except that a polyamide resin which was the same as the material of the adhering resin layer 7 was used as the side surface protective film 9", and the ink jet recording head was manufactured (FIGS. 6B and 6C).

EXAMPLE 3

By forming the uneven shape in the polyamide resin which forms the adhering resin layer 7 and the upper protective film 9' illustrated in FIG. 6A which is referred to in describing Example 2, the wettability of the ink flow path 18 and the adherence between the covering resin layer 11 and the silicon substrate 1 may be improved. The uneven shape may be formed by, for example, forming two layers of the polyamide resin and forming recesses in the upper layer.

An exemplary method for implementation is described in the following.

First, a polyamide resin as a second layer was applied to the surface of the silicon substrate 1 which went through the manufacturing process steps up to the one illustrated in FIG. 6A at a thickness of 2 μm by spin coating.

Then, the polyamide resin was baked in the oven furnace at 100° C. for 30 minutes plus at 250° C. for 60 minutes to be cured.

Next, the above-mentioned IP5700 (trade name) manufactured by TOKYO OHKA KOGYO CO., LTD. was applied on the front surface side of the silicon substrate 1 at a thickness of 5 μm by spin coating.

Then, a photomask was used to carry out exposure with a stepper using i line, development was performed with NMD-3 (trade name) manufactured by TOKYO OHKA KOGYO CO., LTD., and a resist pattern for forming the uneven shape in the second layer of the polyamide resin was formed.

The exposed second layer of the polyamide resin was dry etched by RIE. The etching time was set so that a first layer of the polyamide resin remained.

Figure 7A:
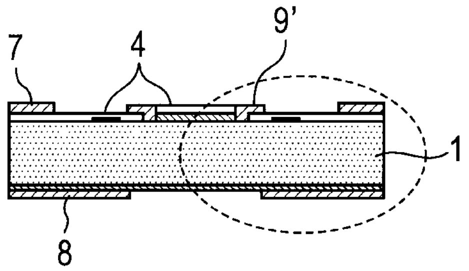
FIGS. 7A, 7B, 7C and 7D are schematic sectional views illustrating a manufacturing method of the embodiment according to the present invention.
Figure 7B:
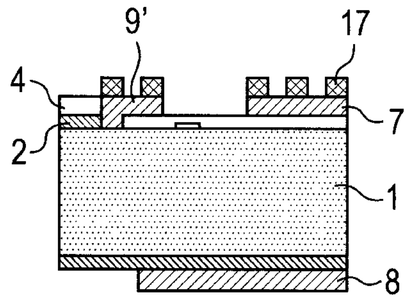

After that, the resist was removed by the remover 1112A (trade name) manufactured by ROHM Co., Ltd. (FIG. 7A). FIG. 7B is an enlarged view of a portion surrounded by the broken line of FIG. 7A.

Further, a photosensitive resin may be used as the second layer of the polyamide resin to form the uneven shape.

Figure 7C:
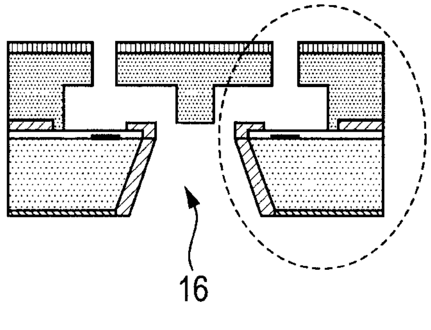
Figure 7D:
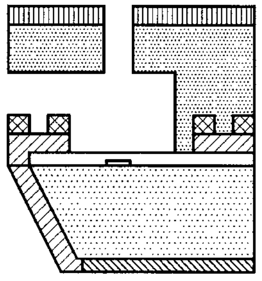

After that, by going through manufacturing process steps similar to those of Example 2, an ink jet recording head illustrated in FIG. 7C was formed. FIG. 7D is an enlarged view of a portion surrounded by the broken line of FIG. 7C.

A peeling test of the ink ejection orifice forming member 11 was performed by dipping into ink the ink jet recording head formed by the method described above under the conditions of 121° C./2 atmospheric pressures/steam atmosphere. As a result, it was confirmed that the adherence was improved compared with a conventional case.

According to the present invention, a material which is the same as a material of a member forming a flow path forming member is used, and thus, a protective film may be formed with ease.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-159746, filed Jul. 14, 2010, which is hereby incorporated by reference herein in its entirety.

What is claimed is:

1. A liquid ejection head, comprising:
a flow path forming member comprising:
an ejection orifice for ejecting liquid therefrom; and
a liquid flow path communicated with the ejection orifice;
a silicon substrate comprising a supply port for supplying the liquid to the liquid flow path; and
a protective film which is formed on a wall surface of the supply port and which is formed of a photosensitive epoxy resin or a photosensitive acrylic resin that is formed of the same material as that of a member forming the flow path forming member.

2. The liquid ejection head according to claim 1, wherein the flow path forming member comprises a covering resin layer which forms a wall surface of the liquid flow path and an adhering resin layer provided between the silicon substrate and the covering resin layer.

3. The liquid ejection head according to claim 2, wherein the protective film is formed using a photosensitive resin which is formed of the same material as that of the covering resin layer.

4. The liquid ejection head according to claim 2, wherein the protective film is formed on the wall surface of the supply port and on a bottom portion of the liquid flow path.

5. The liquid ejection head according to claim 4, wherein the protective film which is formed on the bottom portion of the liquid flow path and the adhering resin layer are uneven in shape.

6. The liquid ejection head according to claim 1, wherein the protective film is resistant to ink.

* * * * *